(12) United States Patent
Xie et al.

(10) Patent No.: US 11,521,894 B2
(45) Date of Patent: Dec. 6, 2022

(54) PARTIAL WRAP AROUND TOP CONTACT

(71) Applicant: International Business Machines Corporation, Armonk, NY (US)

(72) Inventors: Ruilong Xie, Niskayuna, NY (US); Julien Frougier, Albany, NY (US); Ekmini Anuja De Silva, Slingerlands, NY (US); Eric Miller, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 16/932,725

(22) Filed: Jul. 18, 2020

(65) Prior Publication Data

US 2022/0020634 A1   Jan. 20, 2022

(51) Int. Cl.
| | | |
|---|---|---|
| *H01L 29/76* | (2006.01) | |
| *H01L 21/768* | (2006.01) | |
| *H01L 23/528* | (2006.01) | |
| *H01L 23/522* | (2006.01) | |
| *H01L 29/417* | (2006.01) | |

(52) U.S. Cl.
CPC .. *H01L 21/76816* (2013.01); *H01L 21/76829* (2013.01); *H01L 23/5226* (2013.01); *H01L 23/5283* (2013.01); *H01L 29/41791* (2013.01)

(58) Field of Classification Search
CPC ......... H01L 21/76816; H01L 21/76829; H01L 23/5226; H01L 23/5283; H01L 29/41791
See application file for complete search history.

(56) References Cited

U.S. PATENT DOCUMENTS

| | | | |
|---|---|---|---|
| 8,362,574 B2 | 1/2013 | Kawasaki et al. | |
| 8,981,475 B2* | 3/2015 | Sharma | H01L 29/404 |
| | | | 257/341 |
| 9,147,765 B2 | 9/2015 | Xie et al. | |
| 9,397,197 B1 | 7/2016 | Guo et al. | |

(Continued)

FOREIGN PATENT DOCUMENTS

| | | |
|---|---|---|
| CN | 1239823 A | 12/1999 |
| CN | 101783315 A | 7/2010 |

(Continued)

OTHER PUBLICATIONS

International Search Report and Written Opinion for PCT/IB2021/056041 dated Oct. 12, 2021 (10 pages).

*Primary Examiner* — Victor A Mandala
*Assistant Examiner* — Colleen E Snow
(74) *Attorney, Agent, or Firm* — Samuel Waldbaum; Michael J. Chang, LLC (57) ABSTRACT

Contact designs for semiconductor FET devices are provided. In one aspect, a contact structure includes: a metal line(s); a first ILD surrounding the metal line(s), wherein a top surface of the first ILD is recessed below a top surface of the metal line(s); a liner disposed on the first ILD and on portions of the metal line(s); a top contact(s) disposed over, and in direct contact with, the metal line(s), wherein an upper portion of the top contact(s) has a width W1 and a height H1, wherein a lower portion of the top contact(s) has a width W2 and a height H2, and wherein W1<W2 and H1>H2; and a second ILD disposed over the liner and surrounding the top contact(s). A semiconductor FET device and methods for fabrication thereof are also provided.

25 Claims, 11 Drawing Sheets

(56) References Cited

U.S. PATENT DOCUMENTS

| | | |
|---|---|---|
| 9,704,744 B2 | 7/2017 | Leib et al. |
| 9,773,913 B1 | 9/2017 | Balakrishnan et al. |
| 9,953,979 B2 | 4/2018 | Xu et al. |
| 10,074,727 B2 | 9/2018 | Adusumilli et al. |
| 10,084,094 B1 | 9/2018 | Cheng et al. |
| 10,236,218 B1 | 3/2019 | Xie et al. |
| 10,276,687 B1 * | 4/2019 | Bao ................... H01L 21/02532 |
| 2012/0205805 A1 | 8/2012 | Hyun |
| 2015/0162330 A1 | 6/2015 | Lin et al. |
| 2018/0374958 A1 | 12/2018 | Guillorn et al. |
| 2021/0134964 A1 * | 5/2021 | Ho ........................ H01L 29/401 |

FOREIGN PATENT DOCUMENTS

| | | |
|---|---|---|
| CN | 104425360 A | 3/2015 |
| CN | 109728088 A | 5/2019 |
| TW | I240367 B | 9/2005 |

\* cited by examiner

FIG. 10C (continue to FIG. 2A, etc.)

FIG. 11

PARTIAL WRAP AROUND TOP CONTACT

FIELD OF THE INVENTION

The present invention relates to contact structures in semiconductor field-effect transistor (FET) devices, and more particularly, to contact designs for semiconductor FET devices where a lower portion of the top contact partially wraps around the bottom contact to enable zero or negative enclosure.

BACKGROUND OF THE INVENTION

When defining a contact to an underlying structure such as a metal line, it is important to make sure that there is good alignment between the contact and the metal line to avoid unacceptably high contact resistance. To do so, the metal line is often extended to ensure that good landing of the contact occurs. When the contact lands squarely on the underlying metal line, this is referred to as 'positive enclosure' or simply 'enclosure.' In practice, however, perfect alignment of the structures is difficult to achieve. Thus, oftentimes the contact lands at the end of the metal line (called 'zero enclosure') or even overhangs the edge of the metal line (called 'negative enclosure').

Scaling the contact dimensions only exacerbates the alignment issues. As a result, with conventional scaled designs, zero and negative enclosure is often the result which leads to high contact resistance.

Therefore, improved contact structure designs and techniques for fabrication thereof where zero or even negative enclosure is permissible would be desirable.

SUMMARY OF THE INVENTION

The present invention provides contact designs for semiconductor field-effect transistor (FET) devices where a lower portion of the top contact partially wraps around the bottom contact to enable zero or negative enclosure. In one aspect of the invention, a contact structure is provided. The contact structure includes: at least one metal line; a first interlayer dielectric (ILD) surrounding the at least one metal line, wherein a top surface of the first ILD is recessed below a top surface of the at least one metal line; a liner disposed on the first ILD and on portions of the at least one metal line; at least one top contact disposed over, and in direct contact with, the at least one metal line, wherein an upper portion of the at least one top contact has a width W1 and a height H1, wherein a lower portion of the at least one top contact has a width W2 and a height H2, and wherein W1<W2 and H1>H2; and a second ILD disposed over the liner and surrounding the at least one top contact.

In another aspect of the invention, a semiconductor FET device is provided. The semiconductor FET device includes: at least one gate; source/drains on opposite sides of the at least one gate; source/drain contacts disposed on the source/drains; a first ILD surrounding the source/drain contacts, wherein a top surface of the first ILD is recessed below a top surface of the source/drain contacts; a liner disposed on the first ILD and on the source/drain contacts; top contacts disposed over, and in direct contact with, the source/drain contacts, wherein an upper portion of the top contacts has a width W1 and a height H1, wherein a lower portion of the top contacts has a width W2 and a height H2, and wherein W1<W2 and H1>H2; and a second ILD disposed over the liner and surrounding the top contacts.

In yet another aspect of the invention, a method of forming a contact structure is provided. The method includes: patterning at least one trench in a first ILD over the source/drains; forming at least one metal line in the at least one trench; recessing the first ILD such that a top surface of the first ILD is recessed below a top surface of the at least one metal line; depositing a liner on the first ILD and on the at least one metal line; depositing a second ILD onto the liner; and forming at least one top contact in the second ILD and the liner over, and in direct contact with, the at least one metal line, wherein an upper portion of the at least one top contact has a width W1 and a height H1, wherein a lower portion of the at least one top contact has a width W2 and a height H2, and wherein W1<W2 and H1>H2.

In still yet another aspect of the invention, a method of forming a semiconductor FET device is provided. The method includes: forming a device structure having at least one gate, source/drains on opposite sides of the at least one gate, and a first ILD disposed over the source/drains and surrounding the at least one gate; patterning trenches in the first ILD over the source/drains; forming source/drain contacts in the trenches; recessing the first ILD such that a top surface of the first ILD is recessed below a top surface of the source/drain contacts; depositing a liner on the first ILD and on the source/drain contacts; depositing a second ILD onto the liner; and forming top contacts in the second ILD and the liner over, and in direct contact with, the source/drain contacts, wherein an upper portion of the top contacts has a width W1 and a height H1, wherein a lower portion of the top contacts has a width W2 and a height H2, and wherein W1<W2 and H1>H2.

A more complete understanding of the present invention, as well as further features and advantages of the present invention, will be obtained by reference to the following detailed description and drawings.

DETAILED DESCRIPTION OF PREFERRED EMBODIMENTS

As provided above, forming a contact that lands squarely on an underlying metal line (i.e., positive enclosure) is difficult to achieve especially when the device dimensions are scaled. As a result, the contact oftentimes lands at the end of the metal line (i.e., zero enclosure) or even overhangs the edge of the metal line (i.e., negative enclosure). With conventional contact structures, this zero enclosure or negative enclosure can lead to an unacceptably high contact resistance (R).

Advantageously, semiconductor field-effect transistor (FET) designs are provided herein where zero or even negative enclosure is permissible. This configuration is enabled by employing a lower portion of the contact that partially wraps around the underlying metal, thus increasing the contact area and ensuring a low contact resistance. Notably, by permitting zero or negative enclosure scenarios, the present techniques are fully compatible with scaling requirements as the wrap-around design leverages both horizontal and vertical contact surfaces.

An exemplary methodology for forming a semiconductor device in accordance with the present techniques is now described by way of reference to FIGS. 1-11. As will become apparent from the description that follows, this process will be implemented to form a semiconductor FET device having gates 208 and source/drains 210, interconnected by (fin 204) channels, on opposite sides of the gates 208. Source/drain contacts 302 will be formed over the source/drains 210, and top contacts 902 will be formed over the source/drain contacts 302 with a lower portion of the top contacts that partially wraps around the edge of the source/drain contact 302. It is notable that, while the following description uses the source/drain contacts as an illustrative example, the present techniques are more generally applicable to any via-to-metal line contact structure, i.e., in the instant example the metal line is a source/drain contact.

Figure 1:
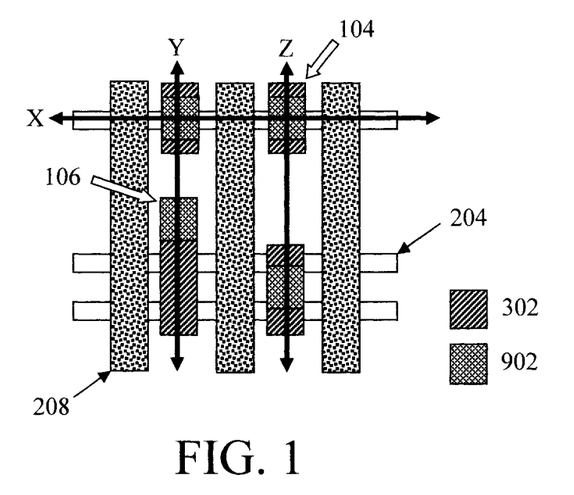
FIG. 1 is a top-down view of the general semiconductor field-effect transistor (FET) design presented herein having fins, gates oriented orthogonal to the fins, and bottom and top source/drain contacts according to an embodiment of the present invention.

In each of the following figures, a cross-sectional view through a part of the semiconductor FET device will be depicted. See, for example, FIG. 1 which shows a top-down view of the general semiconductor FET device design illustrating the orientations of the various cuts through the device that will be depicted in the figures. Referring to FIG. 1, in one exemplary embodiment, the present semiconductor FET device design includes fins, with gates of the semiconductor FET device oriented orthogonal to the fins.

As shown in FIG. 1, a cross-section X will provide views of cuts through the center of one of the fins perpendicular to the gates. A cross-section Y will provide views of cuts through the fins 204 and the source/drain contacts 302 and top contacts 902 between two of the gates 208 in a source/drain region of the device. A cross-section Z will provide views of cuts through the fins 204 and the source/drain contacts 302 and top contacts between another two of the gates 208 in another source/drain region of the device.

FIG. 1 further illustrates the concept of positive versus zero and negative enclosure. Namely, positive enclosure is when the top contact falls squarely on the source/drain contact. See arrow 104. Zero enclosure is when the top contact is present over the end of the source/drain contact, and might even overhang (negative enclosure) the source/drain contact. See arrow 106.

The process begins with the patterning of fins 204 in a substrate 202, the formation of gates 208 and gate spacers 206 over the fins 204, and the formation of source/drains 210 in the fins 204 on opposite sides of the gates 208 offset by the gate spacers 206. See FIG. 2A (a cross-section X), FIG. 2B (a cross-section Y) and FIG. 2C (a cross-section Z).

Figure 2A:
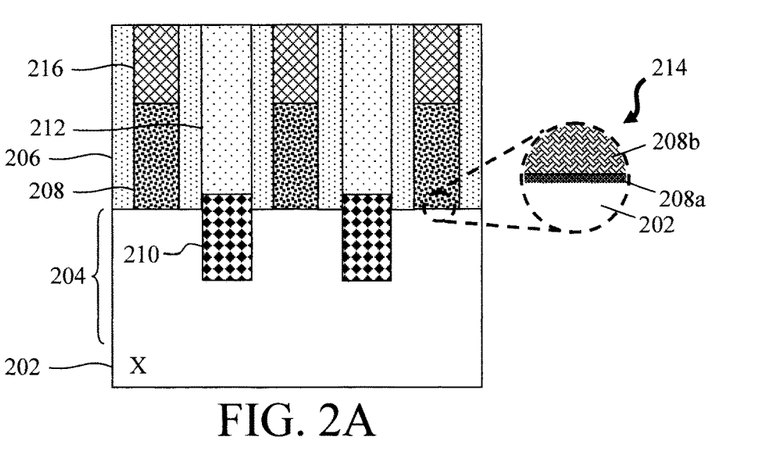
FIG. 2A is a cross-sectional diagram illustrating fins having been patterned in a substrate, the gate spacers and gates having been formed over the fins, source/drains having been formed in the fins on opposite sides of the gates offset by the gate spacers, and a first ILD disposed over the source/drains from a cross-section X through one of the fins.
Figure 2B:
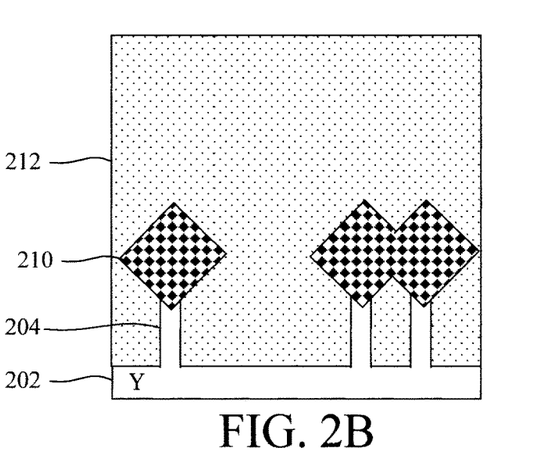
FIG. 2B is cross-sectional diagram illustrating the fins having been patterned in the substrate, the source/drains having been formed in the fins, and the first ILD disposed over the source/drains from a cross-section Y through the bottom/top source/drain contacts between two of the gates.
Figure 2C:
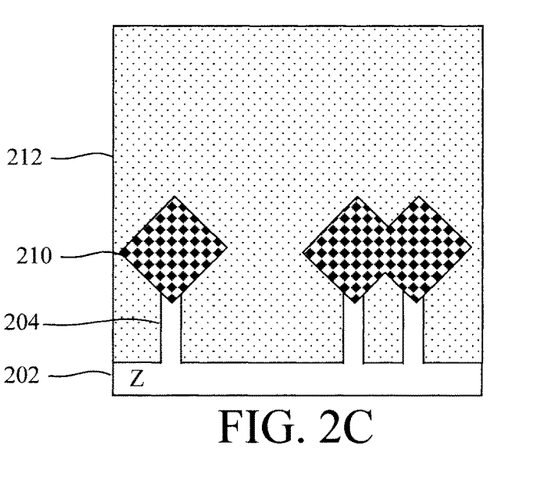
FIG. 2C is a cross-sectional diagram illustrating the fins having been patterned in the substrate, the source/drains having been formed in the fins, and the first ILD disposed over the source/drains from a cross-section Z through the bottom/top source/drain contacts between another two of the gates according to an embodiment of the present invention.

According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 202 may already have pre-built structures (not shown) such as transistors, diodes, capacitors, resistors, interconnects, wiring, etc.

Standard lithography and etching techniques can be used to pattern fins 204 in substrate 202. With standard lithography and etching processes, a lithographic stack (not shown), e.g., photoresist/organic planarizing layer (OPL)/anti-reflective coating (ARC), is used to pattern a hardmask (not shown) with the footprint and location of the fins 204. Alternatively, the hardmask can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern of the fins 204 from the hardmask to the underlying substrate 202. The hardmask is then removed. A directional (anisotropic) etching process such as reactive ion etching (RIE) can be employed for the fin etch.

The fins 204 in this example can have a fixed or variable pitch. For instance, referring to FIG. 2B and FIG. 2C, the distance between the fin on the left and the middle fin is greater than the distance between the middle fin and the fin on the right. By way of example only, this can be achieved by either directly defining the fins 204 with variable pitch in the patterning process or it can be achieved by first patterning the fins 204 at a regular pitch (e.g., a sea of fins), and then selectively removing a fin(s) between the left and center fins.

As shown in magnified view 214 (see FIG. 2A), gates 208 include a gate dielectric 208a and a gate conductor 208b. Although not explicitly shown in magnified view 214, a thin (e.g., from about 0.3 nm to about 5 nm) interfacial oxide (e.g., silicon oxide which may include other chemical elements in it such as nitrogen, germanium, etc.) can first be formed on exposed surfaces of the fins 204, and the gate dielectric 208a deposited over the interfacial oxide. In general, the present techniques can be implemented in conjunction with either a gate-first or a gate-last process. As its name implies, a gate-first process involves formation of the gates over the channel region of the semiconductor FET device prior to placement of the source/drains. Suitable materials for gate spacers 206 include, but are not limited to, oxide spacer materials such as silicon oxide (SiOx) and/or silicon oxycarbide (SiOC) and/or nitride spacer materials such as silicon nitride (SiN), silicon borocarbonitride (SiBCN) and/or silicon oxycarbonitride (SiOCN). Gate spacers 206 offset the gates 208 from the source/drains 210.

By contrast, with a gate-last process sacrificial gates are formed over the channel region of the semiconductor FET device early on in the process. The term 'sacrificial' as used herein refers to a structure that is removed, in whole or in part, during fabrication of the semiconductor FET device. The sacrificial gates are then used to place the source/drains on opposite ends of the channel region. The sacrificial gates are then removed and replaced with a final, i.e., replacement, gate of the device. When the replacement gate is a metal gate, it is also referred to herein as a replacement metal gate or RMG. A notable advantage of the gate-last process is that it prevents the final gate components from being exposed to potentially damaging conditions, such as elevated temperatures, experienced during fabrication. Of particular concern are high-κ gate dielectrics which can be damaged by exposure to elevated temperatures such as those experienced during source/drain formation.

Suitable materials for gate dielectric 208a include, but are not limited to, silicon dioxide ($SiO_2$) and/or a high-κ material. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$). Suitable materials for the gate conductor 208b include, but are not limited to, doped polysilicon and/or at least one workfunction-setting metal. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above.

According to an exemplary embodiment, source/drains 210 are formed from an in-situ doped (i.e., where a dopant(s) is introduced during growth) or ex-situ doped (e.g., where a dopant(s) is introduced by ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B).

An interlayer dielectric (ILD) 212 is disposed over the source/drains 210 and surrounding the gate spacers 206/gates 208. Suitable ILD 212 materials include, but are not limited to, nitride materials such as silicon nitride (SiN) and/or oxide materials such as SiOx and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

As shown for example in FIG. 2A, the tops of the gates 208 are recessed below the tops of the gate spacers 206, and dielectric caps 216 are formed over the (recessed) gates 208. Suitable materials for dielectric caps 216 include, but are not limited to, silicon oxide (SiOx) and/or silicon nitride (SiN). Dielectric caps 216 protect the underlying gates 208 during formation of source/drain contacts 302 over the source/drains 210. See FIG. 3A (a cross-section X), FIG. 3B (a cross-section Y) and FIG. 3C (a cross-section Z).

Figure 3A:
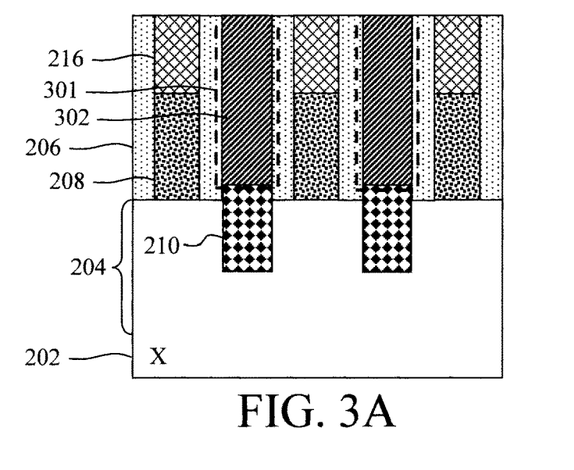
FIG. 3A is a cross-sectional diagram illustrating bottom source/drain contacts having been formed over the source/drains from a cross-section X through one of the fins.
Figure 3B:
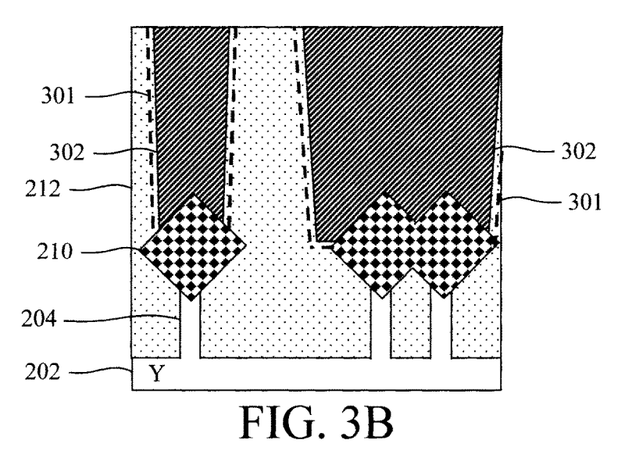
FIG. 3B is cross-sectional diagram illustrating the bottom source/drain contacts having been formed over the source/drains from a cross-section Y through the bottom/top source/drain contacts between two of the gates.
Figure 3C:
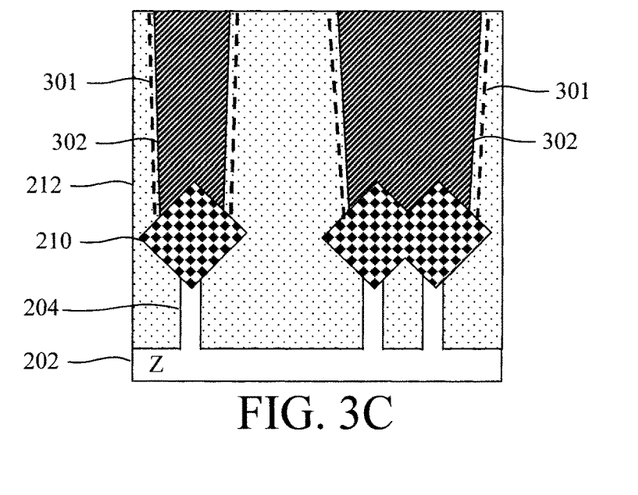
FIG. 3C is a cross-sectional diagram illustrating the bottom source/drain contacts having been formed over the source/drains from a cross-section Z through the bottom/top source/drain contacts between another two of the gates according to an embodiment of the present invention.
Figure 4A:
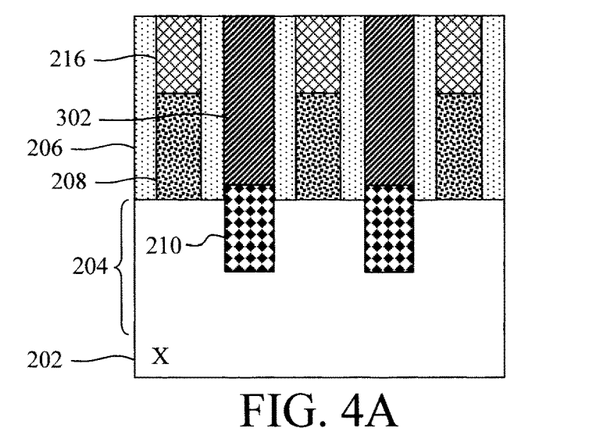
FIG. 4A is a cross-sectional diagram illustrating a selective recess of the first ILD having been performed from a cross-section X through one of the fins.
Figure 4B:
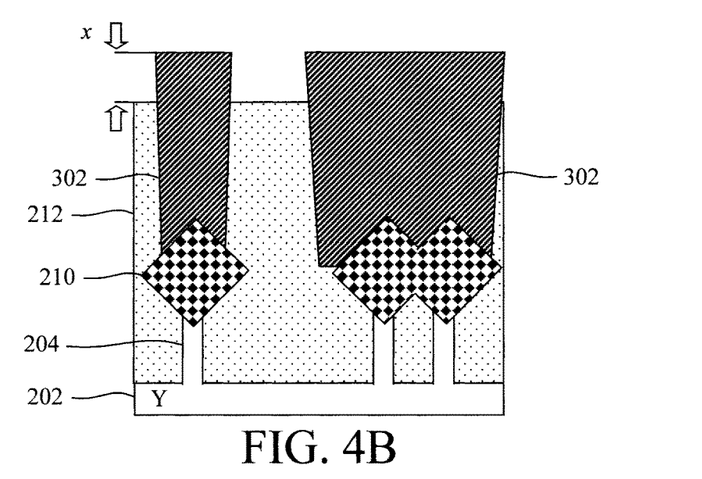
FIG. 4B is cross-sectional diagram illustrating the selective recess of the first ILD having been performed from a cross-section Y through the bottom/top source/drain contacts between two of the gates.
Figure 4C:
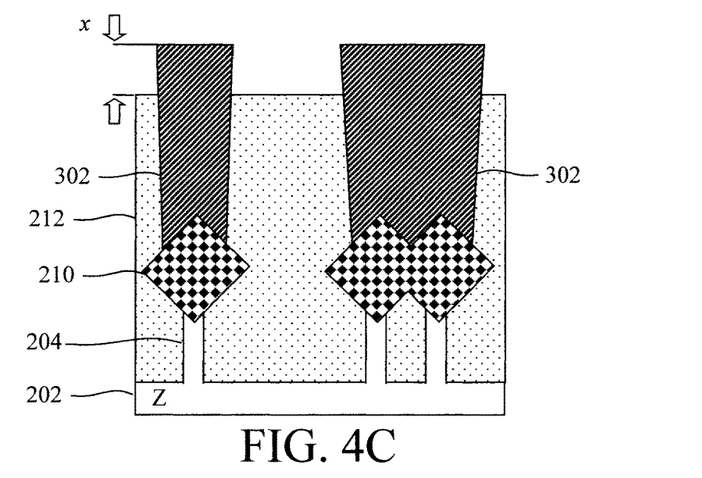
FIG. 4C is a cross-sectional diagram illustrating the selective recess of the first ILD having been performed from a cross-section Z through the bottom/top source/drain contacts between another two of the gates according to an embodiment of the present invention.

To form the source/drain contacts 302, standard lithography and etching techniques (see above) are first employed to pattern contact trenches in the ILD 212. Dotted lines 301 are used to illustrate the outlines of the contact trenches. A contact metal or a combination of contact metals are then deposited into the contact trenches to form metal lines that are the source/drain contacts 302. Suitable contact metals include, but are not limited to, titanium (Ti), titanium nitride (TiN), nickel (Ni) and/or nickel platinum (NiPt) for silicide formation, and copper (Cu), cobalt (Co), ruthenium (Ru) and/or tungsten (W) for low resistance metal fill. A process such as CVD, ALD, evaporation, sputtering or electrochemical plating can be employed to deposit the contact metal(s) into the contact trenches. Following deposition, the metal overburden can be removed using a process such as chemical-mechanical polishing (CMP).

A selective recess of ILD 212 is next performed. See FIG. 4A (a cross-section X), FIG. 4B (a cross-section Y) and FIG. 4C (a cross-section Z). By way of example only, ILD 212 can be recessed using an oxide-selective etch. Following the selective recess etch, the top surface of the ILD 212 is below a top surface of the source/drain contacts 302. According to an exemplary embodiment, the top surface of the ILD 212 is recessed by an amount x below the top surface of the source/drain contacts 302, wherein x is from about 5 nanometers (nm) to about 25 nm and ranges therebetween. Notably, the recess of ILD 212 exposes a portion of the upper sidewall of the source/drain contacts 302 which, as will be described in detail below, will enable the overlying conductive via to partially wrap around the source/drain contacts 302.

Figure 5A:
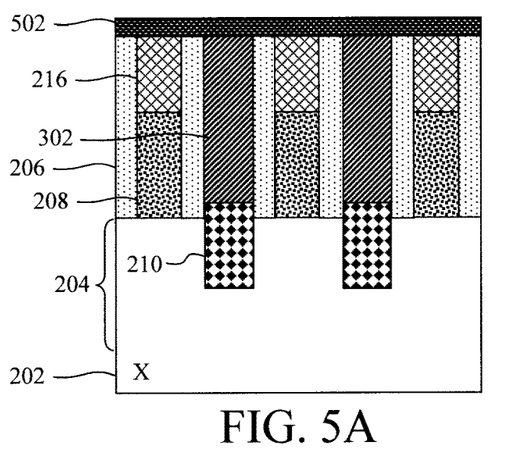
FIG. 5A is a cross-sectional diagram illustrating a liner having been deposited onto the recessed first ILD and bottom source/drain contacts from a cross-section X through one of the fins.
Figure 5B:
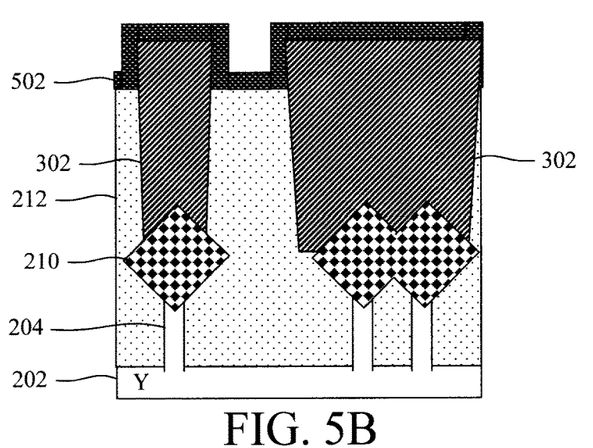
FIG. 5B is cross-sectional diagram illustrating the liner having been deposited onto the recessed first ILD and bottom source/drain contacts from a cross-section Y through the bottom/top source/drain contacts between two of the gates.
Figure 5C:
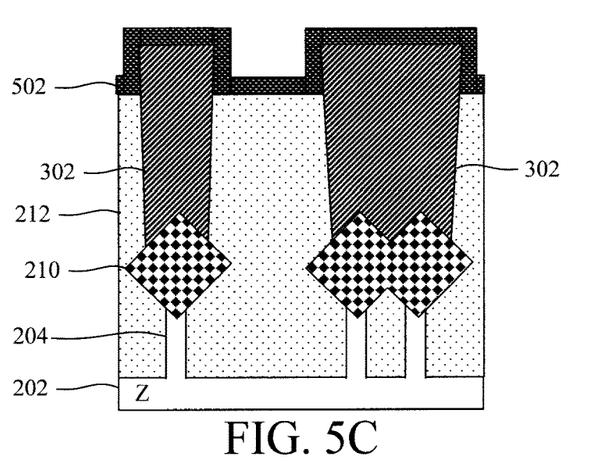
FIG. 5C is a cross-sectional diagram illustrating the liner having been deposited onto the recessed first ILD and bottom source/drain contacts from a cross-section Z through the bottom/top source/drain contacts between another two of the gates according to an embodiment of the present invention.
Figure 6A:
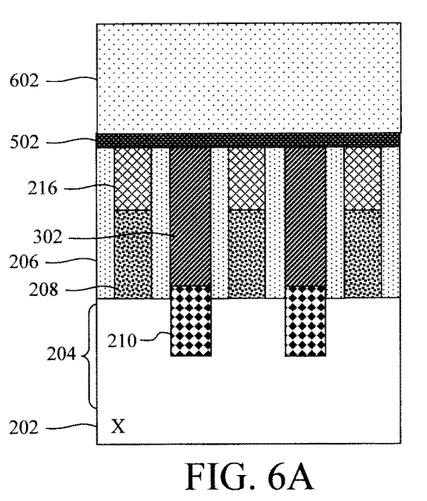
FIG. 6A is a cross-sectional diagram illustrating a second ILD having been deposited over the liner from a cross-section X through one of the fins.
Figure 6B:
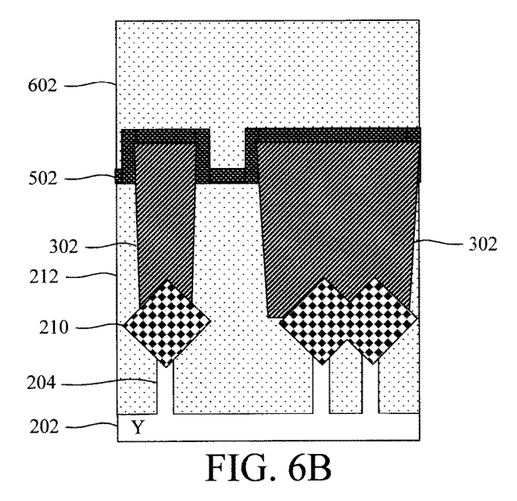
FIG. 6B is cross-sectional diagram illustrating the second ILD having been deposited over the liner from a cross-section Y through the bottom/top source/drain contacts between two of the gates.
Figure 6C:
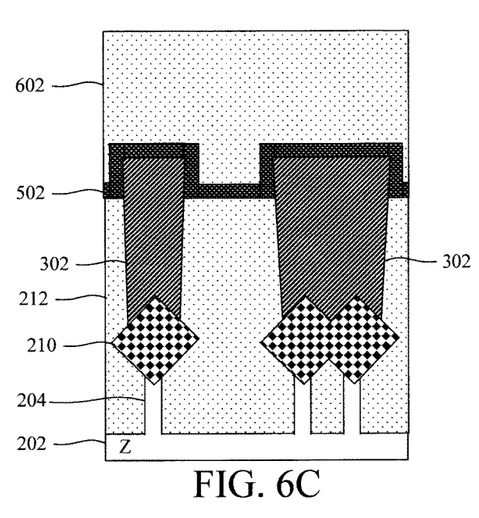
FIG. 6C is a cross-sectional diagram illustrating the second ILD having been deposited over the liner from a cross-section Z through the bottom/top source/drain contacts between another two of the gates according to an embodiment of the present invention.
Figure 7A:
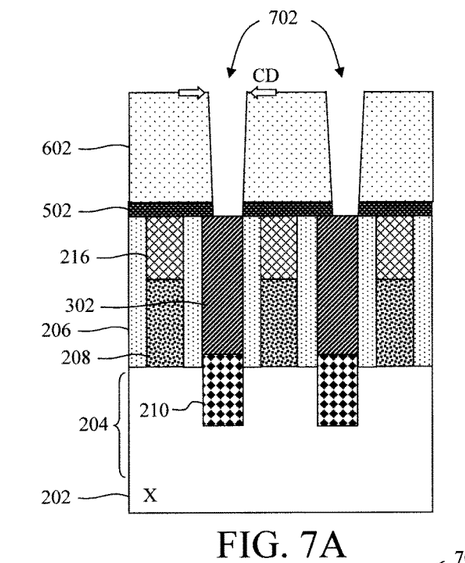
FIG. 7A is a cross-sectional diagram illustrating top contact trenches having been patterned in the second ILD and liner over the bottom source/drain contacts from a cross-section X through one of the fins.
Figure 7B:
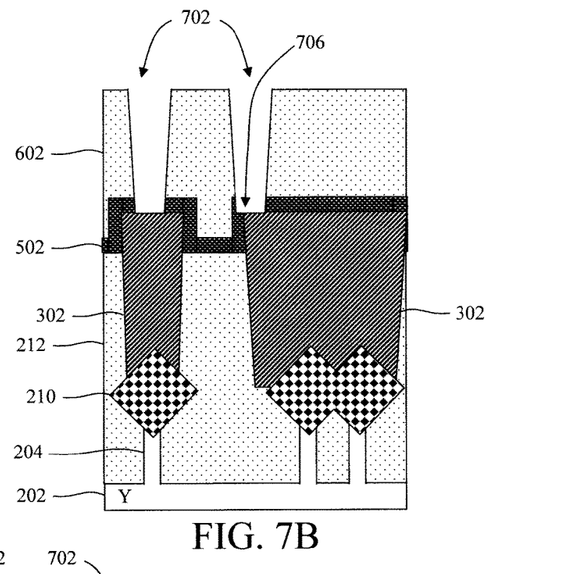
FIG. 7B is cross-sectional diagram illustrating the top contact trenches having been patterned in the second ILD and liner over the bottom source/drain contacts from a cross-section Y through the bottom/top source/drain contacts between two of the gates.
Figure 7C:
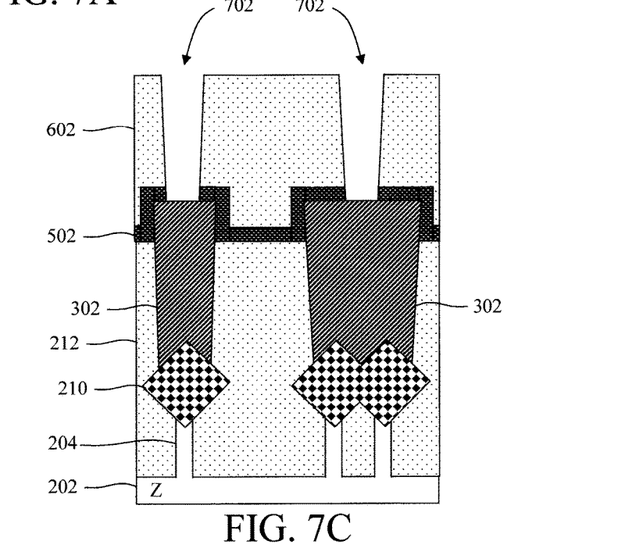
FIG. 7C is a cross-sectional diagram illustrating the top contact trenches having been patterned in the second ILD and liner over the bottom source/drain contacts from a cross-section Z through the bottom/top source/drain contacts between another two of the gates according to an embodiment of the present invention.
Figure 8A:
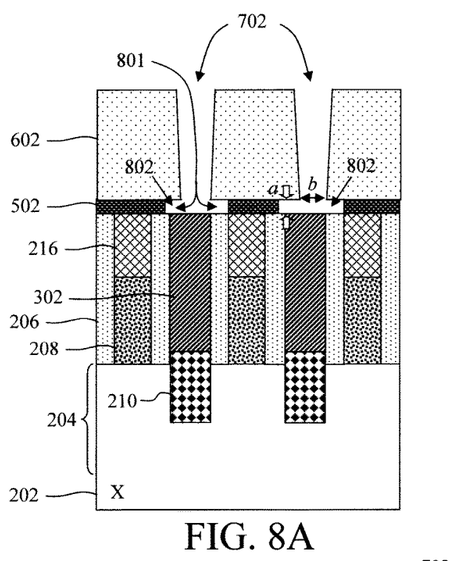
FIG. 8A is a cross-sectional diagram illustrating indentation of the liner having been performed through the top contact trenches to form cavities over the bottom source/drain contacts from a cross-section X through one of the fins.
Figure 8B:
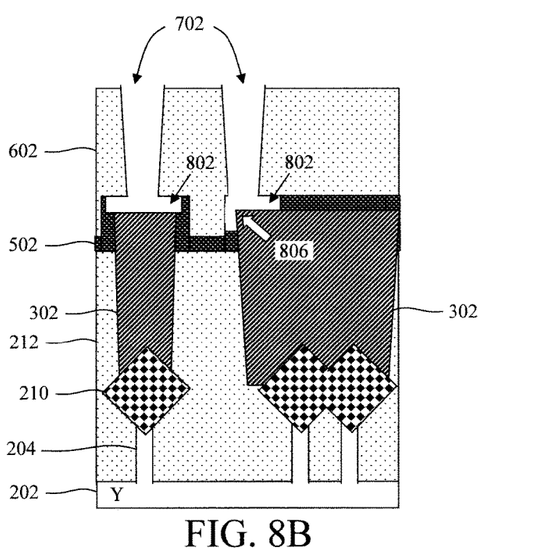
FIG. 8B is cross-sectional diagram illustrating the indentation of the liner having been performed through the top contact trenches to form the cavities over the bottom source/drain contacts from a cross-section Y through the bottom/top source/drain contacts between two of the gates.
Figure 8C:
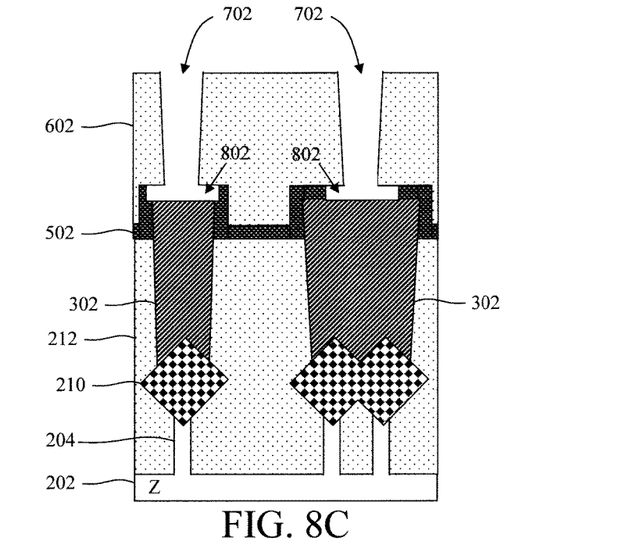
FIG. 8C is a cross-sectional diagram illustrating the indentation of the liner having been performed through the top contact trenches to form the cavities over the bottom source/drain contacts from a cross-section Z through the bottom/top source/drain contacts between another two of the gates according to an embodiment of the present invention.

Namely, a thin, conformal liner 502 is next deposited onto the gate spacers 206, dielectric caps 216, recessed ILD 212, and source/drain contacts 302. See FIG. 5A (a cross-section X), FIG. 5B (a cross-section Y) and FIG. 5C (a cross-section Z). Suitable materials for liner 502 include, but are not limited to, silicon carbide (SiC) and/or silicon oxycarbide (SiCO). A process such as chemical vapor deposition (CVD), atomic layer deposition (ALD), or physical vapor deposition (PVD) can be used to deposit the liner 502. According to an exemplary embodiment, liner 502 has a thickness of from about 2 nm to about 8 nm and ranges therebetween. Notably, as shown in FIG. 5B and FIG. 5C, the liner 502 follows the contour of the source/drain contacts 302 exposed above the recessed ILD 212. Namely, liner 502 is present on the top surfaces of the source/drain contacts 302, as well as on the exposed portions of the upper sidewall of the source/drain contacts 302.

An ILD 602 is next deposited over the liner 502. See FIG. 6A (a cross-section X), FIG. 6B (a cross-section Y) and FIG. 6C (a cross-section Z). The terms 'first' and 'second' may also be used herein when referring to ILD 212 and ILD 602. As provided above, suitable ILD 602 materials include, but are not limited to, nitride materials such SiN and/or oxide materials such as SiOx and/or SiCOH and/or ULK-ILD materials such as pSiCOH. A process such as CVD, ALD or PVD can be employed to deposit the ILD 602. Following deposition, the ILD 602 can be planarized using a process such as CMP.

Standard lithography and etching techniques (see above) are then employed to pattern vias 702 in the ILD 602 and liner 502 over the source/drain contacts 302. See FIG. 7A (a cross-section X), FIG. 7B (a cross-section Y) and FIG. 7C (a cross-section Z). Following the patterning, the liner 502 still remains present over portions of the source/drain contacts 302.

Since zero or even negative source/drain contact to top contact enclosure is permissible (see, e.g., arrow 706 indicating an instance of negative enclosure), a notable benefit of the present techniques is that the top critical dimension (CD) (e.g., width w) of the vias 702 is small, thus lowering the risk of a short to the adjacent gate 208 or to the adjacent source/drain contacts. For instance, according to an exemplary embodiment, the CD of the vias 702 is from about 10 nm to about 30 nm and ranges therebetween. To look at it another way, with conventional processes, zero or negative source/drain contact to via enclosure (see, e.g., FIG. 7B) due to misalignment is a concern as it can lead to a weak connection with a high contact resistance (R). To compensate for this misalignment, the size of the vias can be increased. However, increasing the size of the vias increases the chance of shorting to the adjacent gate or to the adjacent source/drain contacts.

Advantageously, the present partial wrap around top contact will utilize the top surfaces of the source/drain contacts 302, as well as portions of the upper sidewall of the source/drain contacts 302 for making contact. Thus, even if misalignment occurs, there is no need to expand the size of the vias. As such, the risk of shorting to the adjacent gate or to the adjacent source/drain contacts is minimized.

An indentation (see arrows 801) of the liner 502 through the vias 702 is then performed forming cavities 802 over the source/drain contacts 302. See FIG. 8A (a cross-section X), FIG. 8B (a cross-section Y) and FIG. 8C (a cross-section Z). An isotropic etching process such as a wet chemical etch can be employed to indent the liner 502 through the vias 702. A notable feature of the present techniques is that the cavities 802 can wrap around corners 806 of the source/drain contacts 302. For instance, referring to FIG. 8B where the via 702 on the right is present over an edge of the underling source/drain contact 302, it can be seen that the cavity 802 wraps around the corner of that source/drain contact 302. To look at it another way, the cavity 802 is present along the top surface as well as a portion of the upper sidewall of that source/drain contact 302.

Further, it is preferable that the openings into the cavities 802 at the bottoms of the vias 702 are larger than the height of the cavities 802. Namely, referring for example to FIG. 8A, the openings into the cavities 802 at the bottoms of the vias 702 have a width b and the cavities 802 have a height a. Preferably, a<b. This will ensure that there is proper metal fill into the cavities 802 (see below) without the formation of any voids. This condition (i.e., a<b) applies to all of the cavities 802/vias 702 shown in the figures.

A contact metal or a combination of contact metals is then deposited into the vias 702 and cavities 802 to form top contacts 902 in direct contact with the source/drain contacts 302 and surrounded by the ILD 602. See FIG. 9A (a cross-section X), FIG. 9B (a cross-section Y) and FIG. 9C (a cross-section Z). As provided above, suitable contact metals include, but are not limited to, Co, Ru and/or W. A process such as CVD, ALD, evaporation, sputtering or electrochemical plating can be employed to deposit the contact metal(s) into the vias 702. Following deposition, the metal overburden can be removed using a process such as CMP.

Figure 9A:
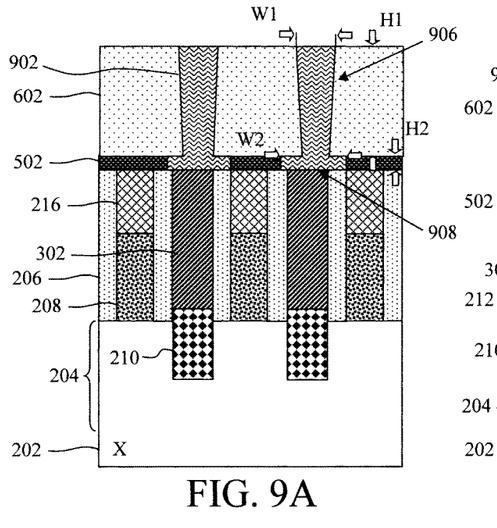
FIG. 9A is a cross-sectional diagram illustrating top source/drain contacts having been formed in the top contact trenches and cavities from a cross-section X through one of the fins.

In order to highlight the unique structure of the present contact design, reference will be made to an upper portion 906 of the top contacts 902 that is formed in the vias 702 and a lower portion 908 of the top contacts 902 that is formed in the cavities 802. For instance, as shown in FIG. 9A the upper portion 906 of the top contacts 902 has a width W1 and a height H1, and the lower portion 908 of the top contacts 902 has a width W2 and a height H2, wherein W1<W2, and H1>H2. To look at it another way, the upper portion 906 of the top contacts 902 has a smaller width, and the lower portion 908 has a short height but a larger width. This condition applies to all of the top contacts 902 shown in the figures.

Figure 9B:
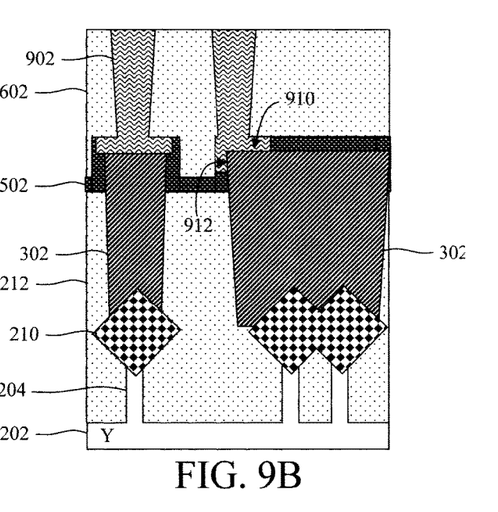
FIG. 9B is cross-sectional diagram illustrating the top source/drain contacts having been formed in the top contact trenches and cavities from a cross-section Y through the bottom/top source/drain contacts between two of the gates.
Figure 9C:
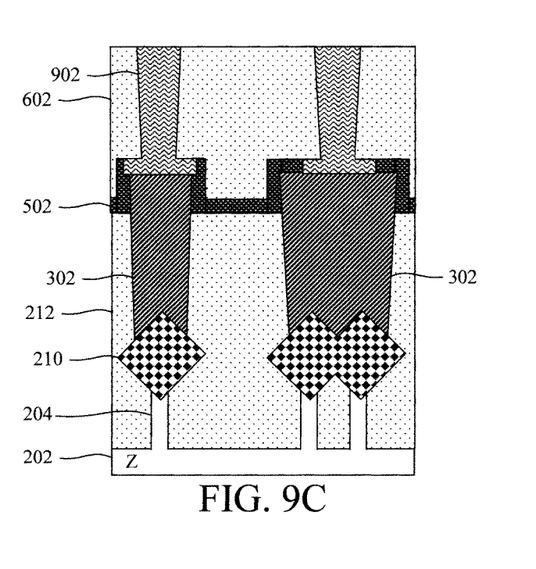
FIG. 9C is a cross-sectional diagram illustrating the top source/drain contacts having been formed in the top contact trenches and cavities from a cross-section Z through the bottom/top source/drain contacts between another two of the gates according to an embodiment of the present invention.

Also, referring to FIG. 9B it can be seen that at least one of the top contacts 902 (i.e., the top contact 902 on the right) partially wraps around the underlying source/drain contact 302. More specifically, this top contact 902 is present along (and in contact with) the top surface 910 and at least a portion of the upper sidewall 912 of the underlying source/drain contact 302.

Metallization techniques can then be employed to form one or more metal layers 1002 over the top contacts 902. See FIG. 10A (a cross-section X), FIG. 10B (a cross-section Y) and FIG. 10C (a cross-section Z). To do so, an ILD 1001 is first deposited onto ILD 602. As provided above, ILD 212 and ILD 602 may be referred herein as the 'first'/'second' ILD, respectively. In accordance with that convention, ILD 1001 may be referred herein as the 'third' ILD. As provided above, suitable ILD 1001 materials include, but are not limited to, nitride materials such SiN and/or oxide materials such as SiOx and/or SiCOH and/or ULK-ILD materials such as pSiCOH. A process such as CVD, ALD or PVD can be employed to deposit the ILD 1001. Following deposition, ILD 1001 can be planarized using a process such as CMP.

Figure 10A:
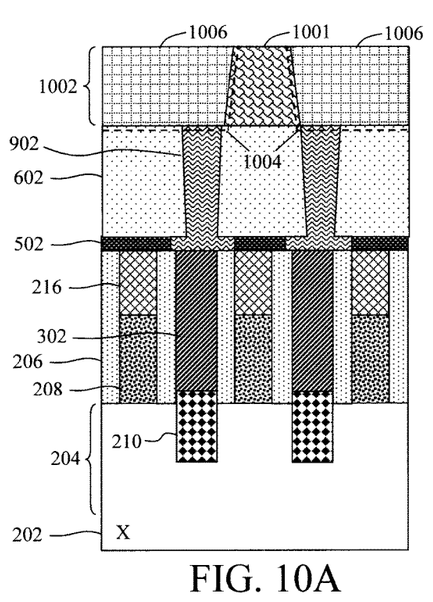
FIG. 10A is a cross-sectional diagram illustrating one or more metal layers having been formed over the top source/drain contacts from a cross-section X through one of the fins.
Figure 10B:
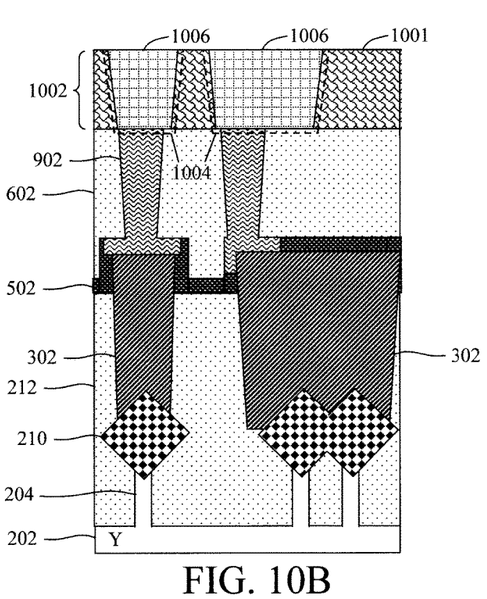
FIG. 10B is cross-sectional diagram illustrating the one or more metal layers having been formed over the top source/drain contacts from a cross-section Y through the bottom/top source/drain contacts between two of the gates.
Figure 10C:
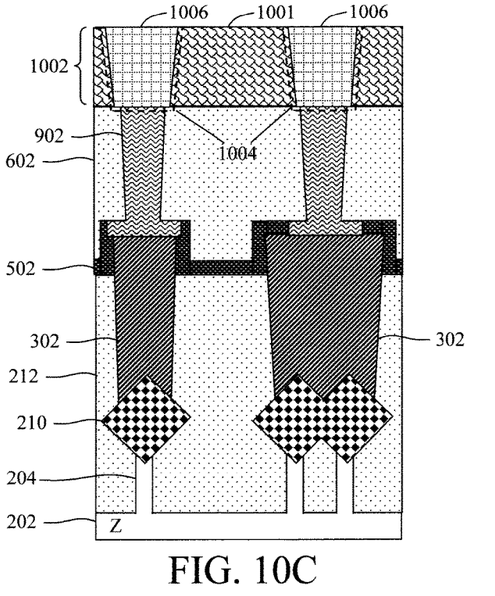
FIG. 10C is a cross-sectional diagram illustrating the one or more metal layers having been formed over the top source/drain contacts from a cross-section Z through the bottom/top source/drain contacts between another two of the gates according to an embodiment of the present invention.

Standard lithography and etching techniques are then employed to pattern features (e.g., trenches and/or vias) in the ILD 1001. The outlines of the features are shown using dotted lines 1004. The features are then filled with a contact metal(s) to form interconnects 1006 in contact with the top contacts 902. As provided above, suitable contact metals include, but are not limited to, Cu, Co, Ru and/or W. The contact metal(s) can be deposited using a process such as CVD, ALD, evaporation, sputtering or electrochemical plating. Following deposition, the metal overburden can be removed using a process such as CMP. Prior to depositing the contact metal(s) into the features, a conformal barrier layer (not shown) can be deposited into and lining the features. Use of such a barrier layer helps to prevent diffusion of the contact metal(s) into the surrounding dielectric. Suitable barrier layer materials include, but are not limited to, tantalum (Ta), tantalum nitride (TaN), titanium (Ti), and/or titanium nitride (TiN). Additionally, a seed layer (not shown) can be deposited into and lining the features prior to contact metal deposition. A seed layer facilitates plating of the contact metal into the features.

As provided above, the present techniques can be implemented in conjunction with a gate-first or a gate-last process. A gate-first process simply involves formation of gates 208 over the channel region of the semiconductor FET device prior to placement of the source/drains 210. A gate-last process, however, involves the use of sacrificial gates prior to placement of the source/drains 210, and subsequent removal and replacement of the sacrificial gates with 'replacement' gates 208. Thus, for illustrative purposes only, the precursor structure to what is shown in FIG. 2A (described above) for the gate-last process is provided in FIG. 11. Like structures are numbered alike in the figures.

Figure 11:
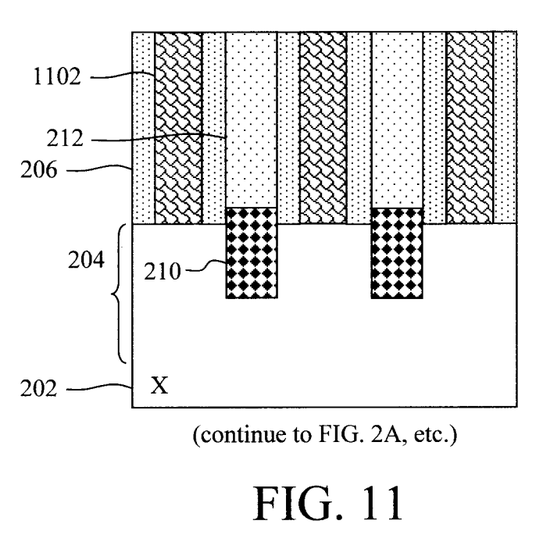
FIG. 11 is a cross-sectional diagram illustrating optional use of sacrificial gates for placing the source/drains in a gate-last process according to an embodiment of the present invention.

As shown in FIG. 11, to begin the gate-last process sacrificial gates 1102 are formed on the fins 204. According to an exemplary embodiment, sacrificial gates are formed by first depositing a suitable sacrificial material onto the substrate 202 over the fins 204, and then patterning the sacrificial material (using a directional (anisotropic) etching process such as RIE) into the individual sacrificial gates 1102 shown in FIG. 11. Suitable sacrificial gate materials include, but are not limited to, poly-silicon (poly-Si) and/or amorphous silicon (a-Si). A process such as CVD, ALD or PVD can be employed to deposit the sacrificial material. According to an exemplary embodiment, a thin (e.g., from about 1 nm to about 3 nm) layer of silicon oxide (SiOx) is first formed on the fins 204.

The gate spacers 206 are then formed on opposite sides of the sacrificial gates 1102. According to an exemplary embodiment, gate spacers 206 are formed by first depositing a suitable spacer material over the sacrificial gates 1102 and then using anisotropic etching techniques such as RIE to etch the spacer material as shown in FIG. 11 such that the final spacer 206 is present along the opposite sidewalls of the sacrificial gates 1102. As provided above, suitable spacer materials include, but are not limited to, oxide spacer materials such as SiOx and/or SiOC and/or nitride spacer materials such as SiN, SiBCN and/or SiOCN. A process such as CVD, ALD or PVD can be employed to deposit the spacer material.

The source/drains 210 are then formed in the fins 204 on opposite sides of the sacrificial gates 1102, offset from the sacrificial gate 1102 by the gate spacers 206. The sacrificial gates 1102 and gate spacers 206 are then buried in the ILD 212 that is deposited over source/drains 210, followed by planarization using a process such as CMP. A process such as CVD, ALD or PVD can be employed to deposit the ILD 212.

The sacrificial gates 1102 are then selectively removed and replaced with gates 208. Thus, in this scenario gates 208 may also be referred to herein as 'replacement' gates. The structure having 'replacement' gates 208 is the same as that shown in FIG. 2A (described above), and the remainder of the process is the same as described above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A contact structure, comprising:
   at least one metal line;
   a first interlayer dielectric (ILD) surrounding the at least one metal line, wherein a top surface of the first ILD is recessed below a top surface of the at least one metal line;
   a liner disposed on the first ILD and on the top surface and an upper sidewall of the at least one metal line;
   at least one top contact disposed over, and in direct contact with, the at least one metal line, wherein an upper portion of the at least one top contact has a width W1 and a height H1, wherein a lower portion of the at least one top contact has a width W2 and a height H2, and wherein W1<W2 and H1>H2; and
   a second ILD disposed over the liner and surrounding the at least one top contact.

2. The contact structure of claim 1, wherein the top surface of the first ILD is recessed by an amount x below the top surface of the at least one metal line, wherein x is from about 5 nm to about 25 nm and ranges therebetween.

3. The contact structure of claim 1, wherein the liner comprises a material selected from the group consisting of: silicon carbide (SiC), silicon oxycarbide (SiCO), and combinations thereof.

4. The contact structure of claim 1, wherein the liner has a thickness of from about 2 nm to about 8 nm and ranges therebetween.

5. The contact structure of claim 1, wherein the at least one top contact partially wraps around the at least one metal line.

6. The contact structure of claim 5, wherein the at least one top contact is present along the top surface and at least a portion of the upper sidewall of the at least one metal line.

7. The contact structure of claim 1, further comprising:
   cavities present in the liner over the at least one metal line; and
   at least one via present in the second ILD over the cavities, wherein the at least one top contact is present in the at least one via and the cavities.

8. The contact structure of claim 1, wherein the at least one metal line comprises a source/drain contact of a semiconductor field-effect transistor (FET) device.

9. A semiconductor FET device, comprising:
   at least one gate;
   source/drains on opposite sides of the at least one gate;
   source/drain contacts disposed on the source/drains;
   a first ILD surrounding the source/drain contacts, wherein a top surface of the first ILD is recessed below a top surface of the source/drain contacts;
   a liner disposed on the first ILD and on the top surface and an upper sidewall of at least one of the source/drain contacts;
   top contacts disposed over, and in direct contact with, the source/drain contacts, wherein an upper portion of the top contacts has a width W1 and a height H1, wherein a lower portion of the top contacts has a width W2 and a height H2, and wherein W1<W2 and H1>H2; and
   a second ILD disposed over the liner and surrounding the top contacts.

10. The semiconductor FET device of claim 9, wherein the liner comprises a material selected from the group consisting of: SiC, SiCO, and combinations thereof.

11. The semiconductor FET device of claim 9, wherein at least one of the top contacts partially wraps around the at least one source/drain contact.

12. The semiconductor FET device of claim 11, wherein the at least one top contact is present along the top surface and at least a portion of the upper sidewall of the at least one source/drain contact.

13. The semiconductor FET device of claim 9, further comprising:
   cavities present in the liner over the source/drain contacts; and
   vias present in the second ILD over the cavities, wherein the top contacts are present in the vias and the cavities.

14. A method of forming a contact structure, comprising:
   patterning at least one trench in a first ILD;
   forming at least one metal line in the at least one trench;
   recessing the first ILD such that a top surface of the first ILD is recessed below a top surface of the at least one metal line;
   depositing a liner on the first ILD and on the at least one metal line;
   depositing a second ILD onto the liner; and
   forming at least one top contact in the second ILD and the liner over, and in direct contact with, the at least one metal line, wherein an upper portion of the at least one top contact has a width W1 and a height H1, wherein a lower portion of the at least one top contact has a width W2 and a height H2, wherein W1<W2 and H1>H2, and wherein, following formation of the at least one top contact, portions of the liner remain present along the top surface and an upper sidewall of the at least one metal line.

15. The method of claim 14, further comprising:
   patterning at least one via in the second ILD over the at least one metal line;
   indenting the liner through the at least one via to form cavities in the liner over the at least one metal line; and
   forming the at least one top contact in the at least one via and the cavities.

16. The method of claim 15, wherein openings into the cavities at a bottom of the at least one via have a width b and the cavities have a height a, wherein a<b.

17. The method of claim 14, wherein the at least one top contact follows a contour of the liner and partially wraps around the at least one metal line.

18. The method of claim 17, wherein the at least one top contact is present along the top surface and at least a portion of the upper sidewall of the at least one metal line.

19. The method of claim 14, wherein the at least one trench is patterned in the first ILD over source/drains of a semiconductor FET device, and wherein the at least one metal line comprises a source/drain contact of the semiconductor FET device.

20. A method of forming a semiconductor FET device, comprising:
   forming a device structure comprising at least one gate, source/drains on opposite sides of the at least one gate, and a first ILD disposed over the source/drains and surrounding the at least one gate;
   patterning trenches in the first ILD over the source/drains;
   forming source/drain contacts in the trenches;
   recessing the first ILD such that a top surface of the first ILD is recessed below a top surface of the source/drain contacts;
   depositing a liner on the first ILD and on the source/drain contacts;
   depositing a second ILD onto the liner; and forming top contacts in the second ILD and the liner over, and in direct contact with, the source/drain contacts, wherein an upper portion of the top contacts has a width W1 and a height H1, wherein a lower portion of the top contacts has a width W2 and a height H2, wherein W1<W2 and H1>H2, and wherein, following formation of the top contacts, portions of the liner remain present along the top surface and an upper sidewall of at least one of the source/drain contacts.

21. The method of claim 20, further comprising:
patterning vias in the second ILD over the source/drain contacts;
indenting the liner through the vias to form cavities in the liner over the source/drain contacts; and
forming the top contacts in the vias and the cavities.

22. The method of claim 20, wherein the liner comprises a material selected from the group consisting of: SiC, SiCO, and combinations thereof.

23. The method of claim 20, wherein at least one of the top contacts follows a contour of the liner and partially wraps around the at least one source/drain contact.

24. The method of claim 23, wherein the at least one top contact is present along the top surface and at least a portion of the upper sidewall of the at least one source/drain contact.

25. The method of claim 20, wherein openings into the cavities at bottoms of the vias have a width b and the cavities have a height a, wherein a<b.

* * * * *